United States Patent [19]

Olsson

[11] Patent Number: 4,630,164
[45] Date of Patent: Dec. 16, 1986

[54] PROTECTIVE CIRCUIT FOR COMPLEMENTARY FIELD-EFFECT TRANSISTORS

[76] Inventor: Bengt G. Olsson, Galärvägen 13, Saltsjö-Boo S-13200, Sweden

[21] Appl. No.: 706,111

[22] Filed: Feb. 27, 1985

[30] Foreign Application Priority Data

Feb. 27, 1984 [SE] Sweden .................................. 8401092

[51] Int. Cl.⁴ .............................................. H02H 9/04
[52] U.S. Cl. ........................................ 361/91; 361/93; 330/264; 330/298
[58] Field of Search ..................... 330/207 P, 264, 298; 361/91, 93

[56] References Cited

U.S. PATENT DOCUMENTS 3,947,727 3/1976 Stewart .................................. 361/91

Primary Examiner—A. D. Pellinen
Assistant Examiner—Jeffrey A. Gaffin
Attorney, Agent, or Firm—Birch, Stewart, Kolasch & Birch

[57] ABSTRACT

A protective circuit for complementary field-effect transistors in a power amplifier including an N-channel transistor whose drain is connected to the positive pole of a voltage source, and whose source is connected to an output terminal as well as to the source of a P-channel transistor whose drain is connected to the negative pole of the voltage source, a second output terminal being connected to the voltage source and the gates of the transistors and being connected to an essentially constant bias source, defining the zero voltage level. The protective circuit is characterized by its ability to provide protection against overvoltages and overcurrents with the aid of zener diodes or zener diode sections, at operating voltages below or equal to the maximum permissible operating voltage, for said transistors. These diodes or diode sections are connected as follows: the first one with its cathode to the gate of the N-channel transistor and with its anode to the collector of the P-channel transistor; the second one with its anode to the gate of the P-channel transistor and with its cathode to the collector of the N-channel transistor.

7 Claims, 4 Drawing Figures

PROTECTIVE CIRCUIT FOR COMPLEMENTARY FIELD-EFFECT TRANSISTORS

BACKGROUND OF THE INVENTION

The invention presented in this document refers to field-effect transistors (FETs) in a complementary coupling with transistor emitters connected together. The purpose of the protective circuit is to provide simultaneous protection of the transistors against overvoltage and overcurrent. A prerequisite for the invention is the high input impedance of FETs.

A common method in present techniques is to have a zener diode connected between gate and drain. In this way, the transistor is gated to higher current when the voltage across the transistor reaches too high a value, thus counteracting the increase. However, this solution is practicable only in circuits with limited current capacity, because otherwise the transistor would be destroyed as a result of the power loss.

SUMMARY OF THE INVENTION

Accordingly, it is a primary object of the present invention to provide an improved protective circuit for field-effect transistors against overvoltage and overcurrent.

The present invention overcomes this weakness in that one of the transistors protects the other (and vice-versa) when the latter is in danger of being subjected to overvoltage. The protection acts through the supply voltage. The advantage of this method is that the current decreases, not increases, when the voltage limitation function is activated.

In accordance with the invention, two zener diodes are connected between each drain of one transistor and the gate of the other transistor. The mode of operation is as follows: as the voltage across one of the transistors rises, the current in the other transistor will eventually decrease—or at least not increase. As a result, the voltage in the first transistor will be limited, because the sum voltage in the amplifier, which is obtained via the two complementary transistors, is constantly equal to the supply voltage. The current in one of the transistors decreases when the current in the other transistor decreases. In other words: the protective circuit limits both current and voltage.

BRIEF DESCRIPTION OF DRAWINGS

The invention is generally illustrated by FIGS. 1-4.

DETAILED DESCRIPTION OF PREFERRED EMBODIMENTS

Figure 1:
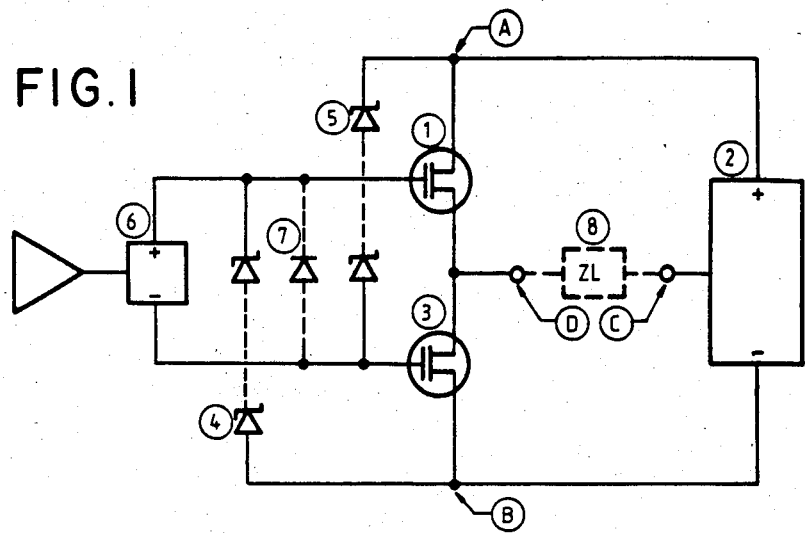
FIG. 1 shows the basic coupling of the protective circuit.

FIG. 1 shows the compulsory basic units, namely an N-channel FET 1, a voltage source 2, a P-channel FET 3, two pairs of zener diodes 4 and 5, and a bias voltage 6. An additional diode 7 can be connected. The figure also includes an imaginary load 8.

The mode of operation in FIG. 1 is as follows:

The drain of the N-channel transistor 1 is connected to the positive pole A of the voltage source 2. The source of transistors 1 and 2 are interconnected to a point D, which is also connected to one of the ends of the load 8. The drain of the P-channel transistor is connected to the negative pole B of the voltage source. The other end of the load 8 is connected to A or B or to an output C on the voltage source 2. The transistors need a bias 6 to permit definition of their operating point through their quiescent current—including the zero bias or the zero quiescent current. The control voltage for the power stage in FIG. 1, which comes from a driving amplifier not shown here, is superimposed on this bias. It is also assumed that the current produced by this driving amplifier is not large enough to destroy the zener diodes 4 or 5, which are connected as described above.

The gating-out process comprises the following phases:

The driving amplifier gates out the power stage. When the input voltage is positive, the current in transistor 1 increases, the voltage across 1 decreases, and the voltage increases across the transistor 3. Here we assume that the voltage from 2 changes insignificantly. When the voltage across 3 reaches approximately Vz, the zener diode 4 will start conducting a current to B, which possibly compensates for the limited current from the driving amplifier. As a result, the voltage across 3 will constantly equal Vz, which is set to a value somewhat below the breakdown of the transistor.

The same process applies when the input voltage is negative. In this case the voltage across 1 will approximately equal Vz.

Figure 2:
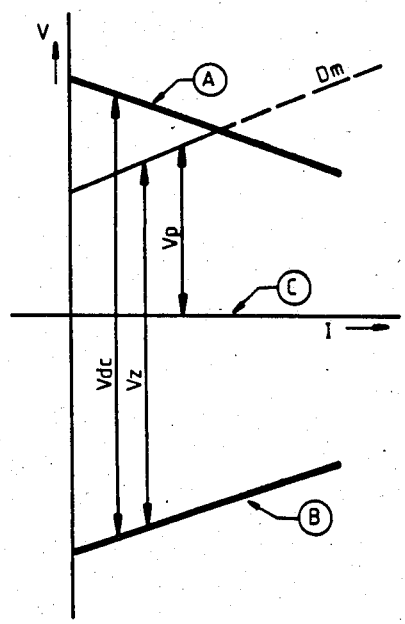
FIG. 2 shows a voltage diagram.

FIG. 2 shows a voltage-current diagram for the voltage source (2) when this is provided with a centre tap C. The broken line represents the maximum voltage Dm on output D in FIG. 1, provided that the gate-source voltage is neglected. The approximation is of no importance to the qualitative function of the protective circuit. The D.C. voltage from the voltage source is denominated Vdc. The zener voltage is denominated Vz.

Vp is the maximum voltage across the load 8. It is assumed that the voltage A and/or B varies with the current I from the voltage source 2 due to unavoidable internal resistance of that source.

In FIG. 2, I is a current flowing through one of the transistors 1 or 3 and through the voltage source 2 and the load 8, causing a voltage drop in the supply voltage Vdc. The maximum voltage on output D is determined by the zener diode 4, which—according to the description of FIG. 1 above—limits the voltage between D and B to the constant value Vz. As shown by FIG. 2, the voltage Vp between D and C will then vary. This represents the voltage across the load and reaches its maximum value when Vdc=Vz.

Figure 3:
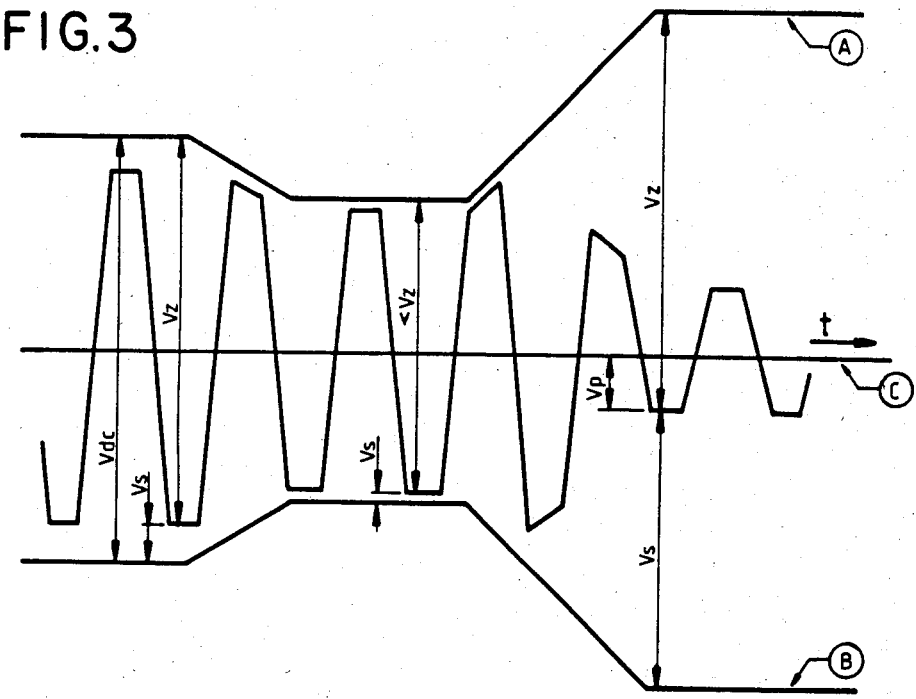
FIG. 3 shows the current and voltage curve-shapes that characterize the invention.

FIG. 3 shows a voltage-time diagram for a trapezoidal voltage approximating a sinusoidal voltage, which is chopped because the protective circuit limits the minimum voltage Vs across one of the transistors. The maximum voltage across the other transistor cannot exceed a given value, approximately Vz. We then obtain (Equation 1): $Vdc \leq Vz + Vs$, where the equality sign applies to limitation through 4 or 5.

FIG. 3 illustrates this concept for a voltage which varies with time. At the same time, the supply voltage Vdc is varied. We then find that when the zener diode 4 or 5 performs its limiting function, the minimum value of the voltage across a transistor, Vs, will be determined by Equation 1, with a sigh of equality. When the Vdc is so low that no limitation can take place (the sign of inequality), Vs is determined by the internal resistance in transistors 1 and 3. The following rule applies to maximum voltage across the load, Vp (Equation 2):

2 Vp≦Vz—Vs. From Equation 1 and 2 we obtain Equation 3:

2 Vp≦2 Vz—Vdc. Equation 3 gives an optimum Vdc value.

Figure 4:
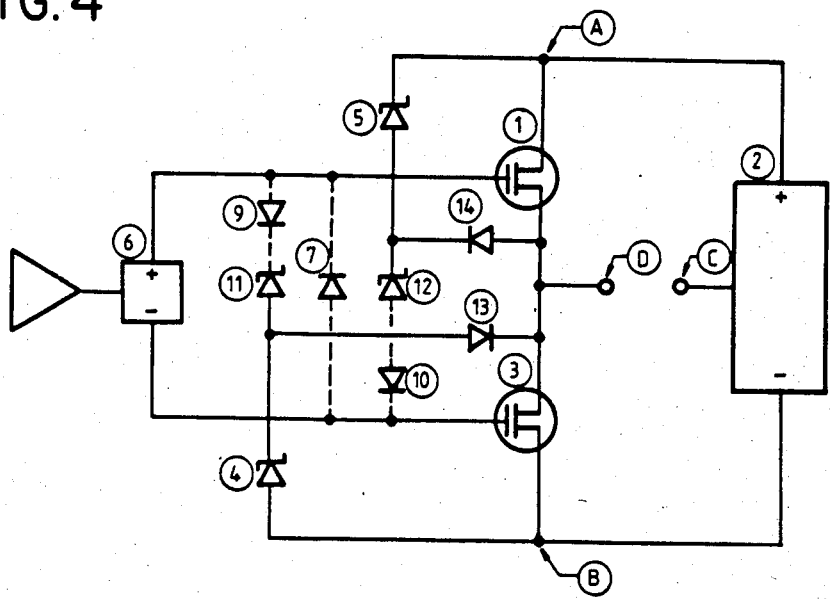
FIG. 4 shows variants of the present invention providing improved gating-out efficiency and/or better protection of the gate.

In FIG. 4, 9 and 10, are diodes inserted in series with the zener diodes 4 and 5, respectively, to enable the voltage on the gates of the respective transistors to assume a value that is numerically higher than that of the drains. This is a practical arrangement aimed at obtaining the minimum Vs when the < sign applies in Equation 1. The diodes prevent the zener diodes from conducting in the forward direction. Example: diode 5 is prevented from conducting when trying to obtain a higher voltage on the gate of 1 than that on its drain. It may prove necessary to make the gate more positive than the drain to be able to gate out the transistor 1 sufficiently at a low drain-source voltage.

This is exemplified by the following imaginary case: Assume that the voltage on 6 is 2 V, and that the drain-source voltage is 5 V at a current of 5 A, which thus will require a voltage of 15 V between gate and source. If we neglect the forward voltage drop in the zener diode (for example, 5), this would limit the voltage on the gate to 2+5=7 V, which would not provide the required current.

In FIG. 4, 11 and 12, are zener diodes, which may form part of the zener diode sections 4 and 5. From the technical point of view, it would be suitable to arrange these sections in the form of several zener diodes connected in series. The diode 13 and 14 limit the gate-source voltage via 9 and 11, and 10 and 12, respectively. This is an advantage when using transistors with insulated gates. Since the insulation is very thin, the breakdown voltage between gate and cathode will be low. This arrangement can be used only in cases where the diodes 11 and 12 with a suitable voltage are already available in the zener diode section 14 or 5, i.e., when 11 and 12 form part of the section concerned.

An absolute condition for proper amplifier function is that Vdc≦2×Vz. Since normal dimensioning of the protective circuit gives Vdc 1.1-1.2×Vz, a considerable increase in the supply voltage, as compared with conventional technique, can be tolerated. This is one of the advantages of the protective circuit discussed here.

Another, more obvious advantage is that the transistors 1 and 3 provide a 50-100% higher output power than conventional arrangements. The invention makes it possible to work with a higher source voltage 2 without running the risk of having breakdowns in the transistors. This would otherwise be the case when Vdc>Vb>Vz, where Vb= the breakdown voltage of the transistor. The breakdown mechanism can be described as follows: Transistors 1 without zener diodes may cause too high a voltage across transistor 3— especially in case of voltage feedback across the amplifier—resulting in a low equivalent impedance, and consequently too large a current in the transistor 3. This risk will be particularly great if the load 8 is not connected, because Vdc will then tend to increase.

We may thus say that the invention means a practically doubled tolerance to voltages. One dimensioning shows that the transistor will supply a 25-40% higher output voltage, which means 50-100% higher power.

The diode 7 is normally not necessary, but may prevent the bias from 6 being reversed due to zener diode currents.

The invention also meets another important requirement, namely that the bias from 6 must not be increased—but rather decreased—in connection with different types of protective intervention. In present techniques, the situation is the opposite, and this results in dangerously increasing quiescent current.

In all practical cases, the supply voltage varies with varying loads, for instance with 2×ΔVdc. Maximum output voltage is obtained within the whole power range if the no-load voltage is Vdc+ΔVdc, and if the full-load voltage is Vdc−ΔVdc. The advantage offered by the invention is that these values can be chosen at typical supply value—corresponding, for instance, to the rated nominal voltage—whereas in conventional techniques the dimensioning must be based on the maximum existing no-load voltage, without providing any margins for increasing the supply voltage in case of mains failures, etc. The invention presented here offers a voltage margin of 75-80%, despite the much higher output power.

Although only one configuration has been illustrated here, it is implicit that several variants within the framework of the invention are possible. One example is the connection of LEDs in series with 9 and 10 to indicate the protective functions. Another example is that the effect of the zener diodes will be reinforced, for instance, by using source followers operating on the gates of transistors 1 or 3. A third application is transistors connected in parallel.

Without abandoning the basic idea of the invention, it will be possible to insert—in series with zener diodes 4 and 5—different elements which only modify the total zener voltage to a small degree, but which still allow the protective circuit to function properly, for instance, gate-source sections in a subsequent power-amplifying transistor.

It should be understood that the invention described herein may be modified, as would occur to one of ordinary skill in the art without departing from the spirit and scope of the present invention.

What is claimed is:

1. In a power amplifier circuit with complementary field-effect transistors including an N-channel transistor, the drain of which is operatively connected to the positive pole of a voltage source, and the source of which is connected to an output terminal of the amplifier and to the source of a P-channel transistor, the drain of said P-channel transistor being connected to the negative pole of said voltage source, the gates of said N-channel and P-channel transistors being connected to a substantially constant bias voltage source defining the zero voltage level of said amplifier, the improvement comprising: zener diode means for protecting said field-effect transistors from overvoltages and over currents at operating voltages lower than or equal to the maximum permissible operating voltages of said transistors including, a first zener diode having a cathode connected to the gate of said N-channel transistor and an anode connected to the drain of said P-channel transistor, and a second zener diode having an anode connected to the gate of said P-channel transistor, and a cathode connected to the drain of the N-channel transistor.

2. The circuit of claim 1 further comprising a diode having a cathode connected to the gate of said N-channel transistor and an anode connected to the gate of said P-channel transistor.

3. The circuit of claim 2, wherein a diode is connected, anode-to-anode, in series with each of said first and second zener diodes.

4. The circuit of claim 3, wherein diode means are connected from the common source of the N-channel and P-channel transistors to said first and second zener diodes to limit voltages on the gates of said transistors to prevent gate breakdown.

5. The circuit of claim 2, wherein diode means are connected from the common source of the N-channel and P-channel transistors to said first and second zener diodes to limit voltages on the gates of said transistors to prevent gate breakdown.

6. The circuit of claim 1, wherein a diode is connected anode-to-anode, in series with each of said first and second zener diodes.

7. The circuit of claim 1, wherein diode means are connected from the common source of the N-channel and P-channel transistors to said first and second zener diodes to limit voltages on the gates of said transistors to prevent gate breakdown.

* * * * *